(12) United States Patent  (10) Patent No.: US 7,476,290 B2
Saito et al.  (45) Date of Patent: Jan. 13, 2009

(54) SUBSTRATE PROCESSING APPARATUS AND SUBSTRATE PROCESSING METHOD

(75) Inventors: Takayuki Saito, Fujisawa (JP); Tsukuru Suzuki, Fujisawa (JP); Kaoru Yamada, Fujisawa (JP); Kenya Ito, Tokyo (JP); Masayuki Kamezawa, Tokyo (JP); Kenji Yamaguchi, Tokyo (JP)

(73) Assignee: Ebara Corporation, Tokyo (JP)

( * ) Notice: Subject to any disclaimer, the term of this patent is extended or adjusted under 35 U.S.C. 154(b) by 629 days.

(21) Appl. No.: 10/695,826

(22) Filed: Oct. 30, 2003

(65) Prior Publication Data

US 2005/0092351 A1 May 5, 2005

(51) Int. Cl.
*B08B 7/04* (2006.01)

(52) U.S. Cl. ............... 156/345.11; 134/56 R; 134/78; 134/902; 156/345.18; 15/306.1; 15/320; 15/300.1

(58) Field of Classification Search ............ 134/61, 134/63, 78, 79, 902, 56 R, 57 R, 58 R; 156/345.11, 156/345.18, 345.22; 15/320, 300.1, 306.1
See application file for complete search history.

(56) References Cited

U.S. PATENT DOCUMENTS

| | | | | |
|---|---|---|---|---|
| 4,838,289 A | * | 6/1989 | Kottman et al. | 134/153 |
| 4,968,375 A | | 11/1990 | Sato et al. | |
| 5,609,943 A | * | 3/1997 | DeKoven et al. | 428/195.1 |
| 5,993,547 A | * | 11/1999 | Sato | 118/50 |
| 6,079,428 A | * | 6/2000 | Anai | 134/172 |
| 6,230,722 B1 | * | 5/2001 | Mitsumori et al. | 134/122 R |

(Continued)

FOREIGN PATENT DOCUMENTS

EP  1058300 A2 * 12/2000

(Continued)

OTHER PUBLICATIONS

European Search Report issued Nov. 19, 2007 in the corresponding European patent application.

*Primary Examiner*—Alexander Markoff
(74) *Attorney, Agent, or Firm*—Wenderoth, Lind & Ponack, L.L.P.

(57) ABSTRACT

The present invention provides a substrate processing apparatus and a substrate processing method suitable for use in an etching apparatus which etches a thin film formed on a peripheral portion of a substrate. The present invention also provides a substrate processing apparatus and a substrate processing method suitable for use in a cleaning apparatus which performs a cleaning process on a substrate which has been etched. The substrate processing apparatus for use in etching includes a substrate holder for holding a substrate substantially horizontally and rotating the substrate, and a processing liquid supply unit for supplying a processing liquid onto a peripheral portion of the substrate which is being rotated in such a manner that the processing liquid is stationary with respect to the substrate. The substrate processing apparatus for use in cleaning a substrate includes a substrate holder for holding a substrate substantially horizontally and rotating the substrate, and a cleaning liquid supply unit having a cleaning liquid outlet which is oriented from a center of the substrate toward a peripheral portion of the substrate with an elevation angle of not more than 45° from a surface of the substrate. The cleaning liquid supply unit supplies a cleaning liquid to the surface of the substrate at a flow velocity of not less than 0.1 m/s.

13 Claims, 11 Drawing Sheets

U.S. PATENT DOCUMENTS

| | | |
|---|---|---|
| 6,398,975 B1 | 6/2002 | Mertens et al. |
| 6,497,240 B1 * | 12/2002 | Kobayashi et al. ........ 134/64 R |
| 6,516,815 B1 * | 2/2003 | Stevens et al. ............ 134/25.4 |
| 6,523,553 B1 * | 2/2003 | Redeker et al. ............... 134/61 |
| 6,669,809 B2 | 12/2003 | Hashimoto et al. |
| 6,932,884 B2 * | 8/2005 | Saito et al. ............ 156/345.17 |
| 2001/0037858 A1 | 11/2001 | Taniyama et al. |
| 2003/0024645 A1 | 2/2003 | Orii et al. |
| 2003/0041968 A1 * | 3/2003 | Saito et al. ............ 156/345.12 |
| 2003/0079764 A1 | 5/2003 | Hirose et al. |
| 2003/0121538 A1 * | 7/2003 | Zahorik et al. .............. 134/184 |

FOREIGN PATENT DOCUMENTS

| | | |
|---|---|---|
| JP | 10-12523 | 1/1998 |
| JP | 2000-82691 | 3/2000 |
| JP | 2002-100603 | 4/2002 |
| WO | 03/023825 | 3/2003 |

* cited by examiner

SUBSTRATE PROCESSING APPARATUS AND SUBSTRATE PROCESSING METHOD

FIELD OF THE INVENTION

The present invention relates to a substrate processing apparatus and a substrate processing method suitable for use in an etching apparatus which etches a thin film formed on a peripheral portion of a substrate. The present invention also relates to a substrate processing apparatus and a substrate processing method suitable for use in a cleaning apparatus which performs a cleaning process on a substrate which has been etched.

DESCRIPTION OF THE RELATED ART

In recent years, instead of using aluminum or aluminum alloys as a material for forming interconnection circuits on a substrate such as a semiconductor wafer, there is an eminent movement towards using copper (Cu) which has a low electric resistivity and high electromigration endurance. Copper interconnects are generally formed by filling copper into fine recesses formed in a surface of the substrate. There are various known techniques for forming such copper interconnects, including CVD, sputtering, and plating. According to any such technique, a copper film is formed on a substantially entire surface of a substrate, followed by removal of unnecessary copper by chemical mechanical polishing (CMP).

Copper can be easily diffused into a silicon oxide film during a semiconductor fabrication process, thus impairing the electric insulation of the silicon oxide film. Therefore, the unnecessary copper, which has been formed on a portion other than circuits, needs to be completely removed from the substrate. Particularly, if the copper formed or deposited on a peripheral portion (including edge portion and bevel portion) of the substrate is rubbed off onto an arm of a transfer robot or a substrate storage cassette, such copper is diffused to cause contamination in subsequent processes, resulting in so-called cross contamination. Therefore, the copper formed or deposited on the peripheral portion of the substrate is required to completely be removed immediately after the copper film growing process or the CMP process is performed.

Thus, an etching process has been widely practiced to remove a copper film formed or deposited on a peripheral portion of a substrate by supplying a processing liquid (an etching liquid) onto the substrate. The etching process is performed in such a manner that the substrate is rotated in a chamber and the processing liquid is supplied onto the peripheral portion of the substrate which is being rotated. The processing liquid, which has been supplied onto the substrate, reacts with the copper film on the substrate to remove the copper film, and is then recovered for reuse in the subsequent etching process.

However, in the conventional etching method, the processing liquid is supplied from a position spaced from the substrate by a certain distance. Accordingly, the processing liquid impinges on the substrate and is scattered, thus causing contamination of an atmosphere in the chamber which requires a high cleanliness. Further, in the conventional method, the processing liquid is continuously supplied so as to replace the processing liquid on the substrate with a new cleaning liquid. However, of all the processing liquid which has been supplied, only a small amount of the processing liquid is used in etching. Therefore, it is necessary to supply a much larger amount of the processing liquid onto the substrate than is required in the actual etching process. Accordingly, there is a need to reduce the amount of processing liquid to be used.

Further, in a conventional cleaning process performed after the etching, generally, a large amount cleaning liquid is supplied onto the entire surface of the substrate so as to wash out the processing liquid (the etching liquid) remaining on the peripheral portion of the substrate. Accordingly, although only the peripheral portion is required to be cleaned, the cleaning liquid is supplied to a portion which is not required to be cleaned. If a large amount of the cleaning liquid is supplied onto the substrate, the cleaning liquid containing the etching liquid is spattered on the surface of the substrate or scattered in the chamber, thus contaminating a portion of the substrate which is not a target area to be etched. Further, the cleaning liquid is spattered on a wall surface of the chamber, thus causing the contamination of the atmosphere in the chamber.

SUMMARY OF THE INVENTION

The present invention has been made in view of the above drawback. It is therefore a first object of the present invention to provide a substrate processing apparatus and a substrate processing method which can supply a processing liquid onto a substrate without causing the processing liquid to be scattered so that a clean atmosphere in a chamber can be maintained, and can reduce an amount of the processing liquid to be used.

It is a second object of the present invention to provide a substrate processing apparatus and a substrate processing method which can supply a cleaning liquid only to a necessary area of the substrate without causing the cleaning liquid to be scattered so that a clean atmosphere in a chamber can be maintained, and can reduce an amount of the cleaning liquid to be used.

In order to achieve the above object, the present invention provides a substrate processing apparatus comprising: a substrate holder for holding a substrate substantially horizontally and rotating the substrate; and a processing liquid supply unit for supplying a processing liquid onto a peripheral portion of the substrate which is being rotated in such a manner that the processing liquid is stationary with respect to the substrate.

According to the present invention having such a structure, the processing liquid can be supplied onto the substrate without being scattered. As a result, a clean atmosphere in the chamber can be maintained, and an efficiency of reaction between the processing liquid and a thin film can be improved, thus enabling a reduction in an amount of the processing liquid to be used.

In a preferred aspect of the present invention, the substrate processing apparatus comprises a processing liquid removal unit for removing the processing liquid from the substrate.

In a preferred aspect of the present invention, the processing liquid removal unit sucks the processing liquid on the substrate.

With this structure, an amount and a presence area of the processing liquid staying on the substrate can be kept constant. Further, most of the processing liquid is removed by the processing liquid removal unit and only a small amount of the processing liquid flows out of the substrate. Therefore, it is possible to prevent contamination of the atmosphere in the chamber.

In a preferred aspect of the present invention, the processing liquid removal unit comprises a gas-liquid separator for separating the sucked processing liquid and a gas from each other.

In a preferred aspect of the present invention, the substrate processing apparatus comprises a recovery unit for recovering the processing liquid which has been separated by the gas-liquid separator so as to supply the recovered processing liquid to the processing liquid supply unit.

With this structure, the processing liquid can be recovered for reuse, and hence a total amount of the processing liquid to be used can be reduced.

In a preferred aspect of the present invention, the substrate processing apparatus comprises a plurality of the processing liquid supply units.

In a preferred aspect of the present invention, the substrate processing apparatus comprises a plurality of the processing liquid removal units.

In this case, for example, if a first processing liquid supply unit is disposed above the peripheral portion of the substrate and a second processing liquid supply unit is disposed radially outwardly of the substrate, a circumferential portion (a side portion) and the peripheral portion of the substrate can be processed securely, and hence an area to be processed can be accurately processed.

In a preferred aspect of the present invention, the substrate processing apparatus comprises a purge mechanism for supplying an inert gas to a surface of the substrate.

According to another aspect of the present invention, there is provided a substrate processing method comprising: holding a substrate substantially horizontally and rotating the substrate; supplying a processing liquid onto a peripheral portion of the substrate which is being rotated in such a manner that the processing liquid is stationary with respect to the substrate; and sucking the processing liquid on the substrate.

According to another aspect of the present invention, there is provided a substrate processing apparatus comprising: a substrate holder for holding a substrate substantially horizontally and rotating the substrate; and a cleaning liquid supply unit having a cleaning liquid outlet which is oriented from a center of the substrate toward a peripheral portion of the substrate with an elevation angle of not more than 45° from a surface of the substrate; wherein the cleaning liquid supply unit supplies a cleaning liquid to the surface of the substrate at a flow velocity of not less than 0.1 m/s.

According to the present invention having such a structure, the cleaning liquid can be supplied only to a necessary area of the substrate without being scattered. As a result, a clean atmosphere in the chamber can be maintained. Further, since the cleaning liquid is supplied only to the necessary area, an amount of the cleaning liquid to be used can be reduced.

In a preferred aspect of the present invention, the cleaning liquid supply unit is disposed closely to the surface of the substrate. With this structure, the cleaning liquid can be prevented from being scattered, and the area necessary to be cleaned can be cleaned efficiently.

In a preferred aspect of the present invention, the substrate processing apparatus comprises a receiving unit disposed in the same plane as the surface of the substrate and opens toward an area of the substrate where the cleaning liquid is supplied to, the cleaning liquid being received by the receiving unit and recovered through the receiving unit.

With this structure, the cleaning liquid, which has cleaned the necessary area, is recovered by the receiving unit. Therefore, the cleaning liquid can be prevented from being scattered in the chamber, and the recovered cleaning liquid can be recycled.

According to another aspect of the present invention, there is provided a substrate processing method comprising: providing a cleaning liquid outlet which is oriented from a center of a substrate toward a peripheral portion of the substrate with an elevation angle of not more than 45° from a surface of the substrate; and supplying a cleaning liquid at a flow velocity of not less than 0.1 m/s so as to clean at least one of a front surface and a back surface of the substrate which is being rotated.

According to another aspect of the present invention, there is provided a substrate processing method comprising: supplying a processing liquid to a peripheral portion of a substrate which is being rotated; and supplying a cleaning liquid to an area including the peripheral portion of the substrate which has been processed by the processing liquid so as to remove the processing liquid remaining on the peripheral portion of the substrate. The cleaning liquid is supplied from a cleaning liquid outlet which is oriented from a center of the substrate toward the peripheral portion of the substrate with an elevation angle of not more than 45° from a surface of the substrate.

According to the present invention, since the cleaning liquid is supplied only to the necessary area without being scattered, it is possible to prevent contamination of a portion of the substrate caused by the remaining processing liquid sputtered on such a portion unnecessary to be etched. Further, such prevention of the contamination in the chamber can eliminate contamination of the substrate which would occur during or after the processing and can also eliminate contamination of a substrate which would occur during a subsequent processing.

In a preferred aspect of the present invention, the cleaning liquid is supplied from the cleaning liquid outlet toward the peripheral portion of the substrate in a direction substantially parallel to the surface of the substrate.

In a preferred aspect of the present invention, the substrate processing method comprises receiving the cleaning liquid by a receiving unit which is disposed in the same plane as the surface of the substrate and opens toward the area of the substrate where the cleaning liquid is supplied to; and recovering the cleaning liquid through the receiving unit.

DETAILED DESCRIPTION OF THE PREFERRED EMBODIMENTS

Figure 1:
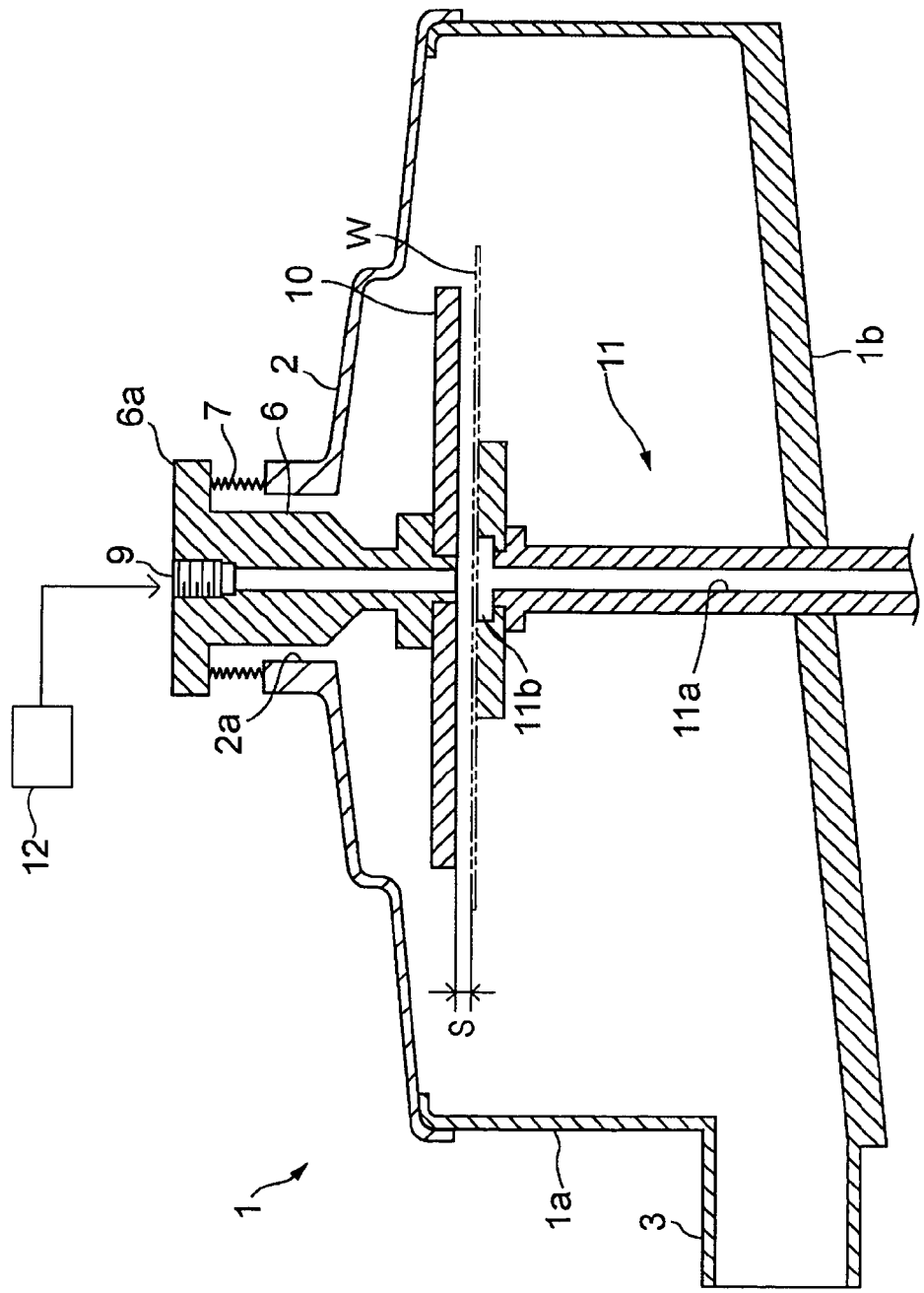
FIG. 1 is a cross-sectional view showing a substrate processing apparatus, which is applied to an etching apparatus, according to a first embodiment of the present invention.

Embodiments of the present invention will be described with reference to the drawings. In the respective drawings, like or corresponding parts are denoted by the same reference numerals or similar reference numerals, and will not be described repetitively. The embodiments will be described hereinafter for the purpose of illustrating the present invention, and it should be understood that the present invention is not limited to the embodiments which will be described below.

FIG. 1 is a cross-sectional view showing a substrate processing apparatus, which is applied to an etching apparatus, according to a first embodiment of the present invention. A chamber 1 for accommodating a wafer W comprises a cylindrical chamber body 1a, and a chamber cover 2 for covering an upper end of the chamber body 1a. The chamber body 1a extends vertically, and a lower end thereof is covered with a bottom portion 1b. The chamber cover 2 has a reverted-dish shape and covers the upper end of the chamber body 1a. The upper end of the chamber body 1a and a peripheral edge of the chamber cover 2 are contacted hermetically with each other so that an interior space of the chamber 1 can be sealed from the exterior.

The bottom portion 1b is slightly inclined with respect to a horizontal plane, and a discharge pipe 3 for discharging both a gas and a liquid is provided on a lowermost portion of the slope, i.e., a portion connecting the bottom portion 1b and the chamber body 1a.

An open mouth 2a is formed in a central portion of the chamber cover 2, and an upper shaft 6 extends vertically to pass through the open mouth 2a. The upper shaft 6 has a circular-plate-like flange 6a at an upper edge thereof. The open mouth 2a of the chamber cover 2 and the flange 6a are hermetically connected to each other by a bellows-like (accordion-like) flexible joint 7. An introduction pipe 9 is provided so as to extend through a central portion of the upper shaft 6. This introduction pipe 9 is connected to an inert gas supply source 12 so that an inert gas such as a nitrogen gas ($N_2$) or an argon (Ar) is supplied to a surface of the wafer W through the introduction pipe 9.

The chamber cover 2 and the upper shaft 6 are coupled to each other by a coupling member (not shown). This coupling member has a drive mechanism (not shown) for moving the upper shaft 6 with respect to the chamber cover 2, so that a relative position between the chamber cover 2 and the upper shaft 6 can be adjusted by the drive mechanism. The above-mentioned flexible joint 7 is expanded and contracted in accordance with a change in the relative position between the chamber cover 2 and the upper shaft 6, thus keeping the interior space of the chamber 1 gas-tight.

An upper disk 10 in the form of a circular plate is attached to a lower end of the upper shaft 6 and disposed in a horizontal state. The upper disk 10 is disposed in such a state that a lower surface thereof faces the surface of the circular wafer W, which is a substrate to be processed, and is parallel to the surface of the wafer W. A gap S between the lower surface of the upper disk 10 and the upper surface of the wafer W should preferable be as small as possible, and is appropriately adjusted in the range of 0.5 to 20 mm, for example. This gap S is adjusted preferably in the range of about 0.8 to 10 mm, more preferably in the range of about 1 to 4 mm, so that the inert gas supplied through the introduction pipe 9 flows uniformly over the surface of the wafer W. By adjusting the gap S, it is possible to protect the wafer W with a relatively small amount of the inert gas. The adjustment of the gap S is performed by adjusting the relative position between the upper shaft 6 and the chamber cover 2. The upper shaft 6, the upper disk 10, and the inert gas supply source 12 constitute a purge mechanism.

Inside the chamber 1, there is disposed a vacuum chuck (a substrate holder) 11 for holding the wafer W substantially horizontally and rotating the wafer W. The vacuum chuck 11 has a through-hole 11a formed therein and which communicates with a vacuum source (not shown), and this through-hole 11a also communicates with an opening portion 11b formed in an upper end of the vacuum chuck 11. The wafer W is placed on an upper surface of the vacuum chuck 11, and is attracted to and held by the vacuum chuck 11 due to a vacuum produced by the vacuum source. Further, the vacuum chuck 11 is coupled to a drive source (not shown) for rotating the vacuum chuck 11, so that the wafer W attracted to and held by the vacuum chuck 11 is rotated by the drive source together with the vacuum chuck 11. A rotational speed of the wafer W is required to be low. Specifically, the rotational speed of the wafer W is not more than 500 $min^{-1}$, preferably in the range of 5 to 200 $min^{-1}$.

Figure 2A:
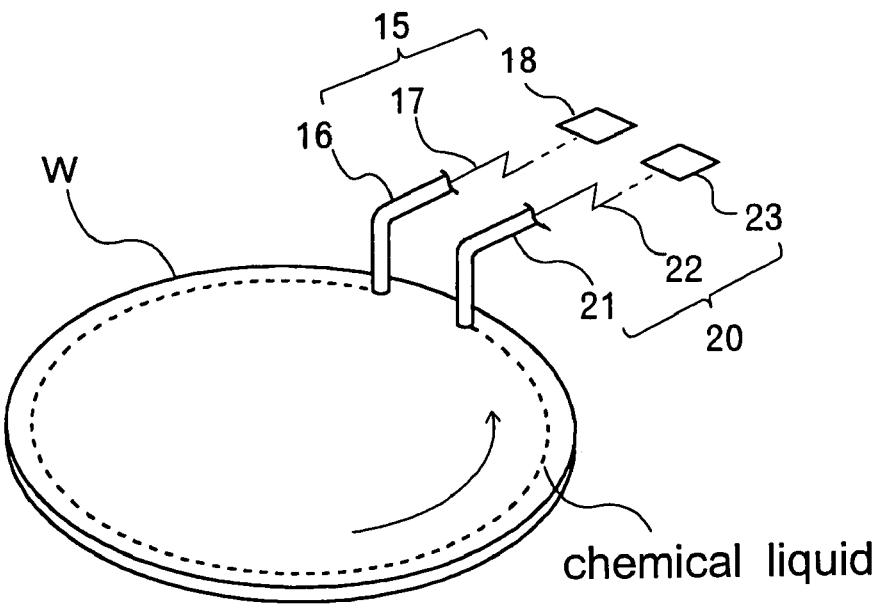
FIG. 2A is a perspective view showing an etching section of the substrate processing apparatus (the etching apparatus) according to the first embodiment of the present invention.
Figure 2B:
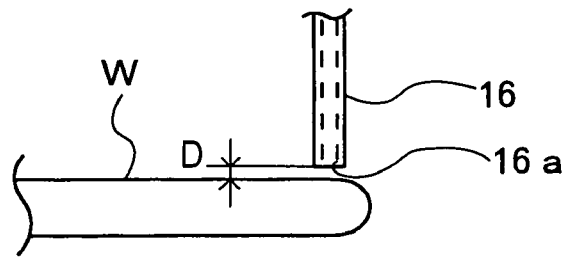
FIG. 2B is a side view showing the etching section in FIG. 2A.
Figure 2C:
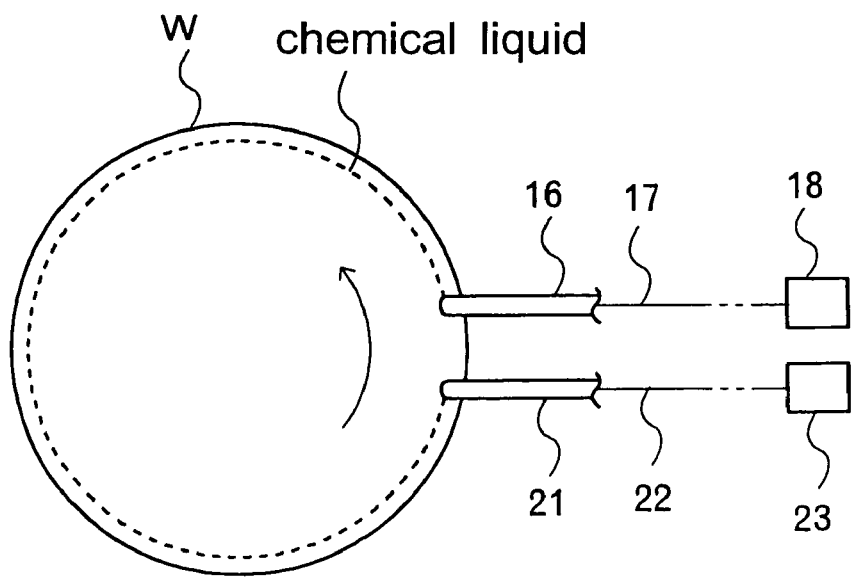
FIG. 2C is a plan view showing the etching section in FIG. 2A.

Next, an etching section incorporated in the substrate processing apparatus (etching apparatus) according to the present embodiment will be described with reference to FIG. 2. FIG. 2A is a perspective view showing an etching section of the substrate processing apparatus according to the present embodiment, FIG. 2B is a side view showing the etching section in FIG. 2A, and FIG. 2C is a plan view showing the etching section in FIG. 2A.

The etching section comprises a chemical liquid supply unit (a processing liquid supply unit) 15 for supplying a chemical liquid (a processing liquid) to the wafer W, and a chemical liquid removal unit (a processing liquid removal unit) 20 for removing the chemical liquid from the wafer W. The chemical liquid supply unit 15 comprises a supply nozzle 16 for supplying the chemical liquid onto a peripheral portion of the wafer W, a chemical liquid introduction pipe 17 connected to the supply nozzle 16, and a chemical liquid storage tank 18 connected to the chemical liquid introduction pipe 17. As shown in FIG. 2B, the supply nozzle 16 has an open end 16a positioned closely to the peripheral portion of the wafer W so that the chemical liquid stored in the chemical liquid storage tank 18 is supplied from the open end 16a of the supply nozzle 16 to the peripheral portion of the wafer W through the chemical liquid introduction pipe 17.

The peripheral portion of the wafer is a peripheral area of a wafer where no circuits are formed thereon, or a peripheral area of a wafer where circuits are formed thereon, but are not used for a device eventually. In this embodiment, the chemical liquid for etching a copper film is used as a processing liquid. Therefore, the chemical liquid supply unit 15 and the chemical liquid removal unit 20 serve as a processing liquid supply unit and a processing liquid removal unit, respectively.

The chemical liquid supplied from the chemical liquid supply unit 15 comprises a liquid mixture containing at least one of mineral acid and organic acid, and further containing at least one of hydrogen peroxide ($H_2O_2$) water and ozone ($O_3$) water, each of which serves as an oxidizing agent. Hydrofluoric acid (HF), hydrochloric acid (HCl), nitric acid ($HNO_3$), sulfuric acid ($H_2SO_4$), or the like may be used as the mineral acid. Acetic acid, formic acid, oxalic acid, or the like may be used as the organic acid.

In a case where a ruthenium film is an object to be etched, a strong-alkali oxidizing agent solution comprising a solution of a halogenated oxygen acid salt such as hypochlorite, chlorite, or bromate may be used as the chemical liquid (the processing liquid) supplied from the chemical liquid supply unit 15. Alternatively, a mixed solution of an alkaline agent containing e.g. an organic alkali such as ammonia, tetramethylammonium hydroxide, or trimethylamine, and an oxidizing agent such as bromine, iodine, chlorine dioxide, or ozone may be used as the chemical liquid (processing liquid).

In this embodiment, a flow rate and flow velocity of the chemical liquid supplied from the supply nozzle 16 are set low. Specifically, the flow rate of the chemical liquid should preferably be not more than 100 ml/min, more preferably be 20 ml/min, furthermore preferably be not more than 5 ml/min. A distance D between the open end 16a of the supply nozzle 16 and the surface of the wafer W should preferably be not more than 5 mm, more preferably be not more than 1 mm.

In this manner, because a small amount of the chemical liquid is supplied from a position close to the wafer onto the wafer which is being rotated at a low speed, the chemical liquid on the wafer is stationary with respect to the wafer. "The chemical liquid is stationary with respect to the wafer" means that the chemical liquid, which has been supplied from the fixedly-positioned chemical liquid supply unit 15 onto the wafer being rotated, stays on a point where the chemical liquid contacts the wafer, and is relatively stationary when viewed from the wafer. Specifically, the chemical liquid supplied onto the wafer is not moved in the rotating direction of the wafer and does not flow off of the wafer due to a centrifugal force. Therefore, according to the present embodiment, the chemical liquid stays on the wafer without flowing off the wafer, and hence the chemical liquid is kept in contact with the wafer for a longer period of time than ever, thus enabling a reduction in an amount of the chemical liquid to be used.

Figure 3A:
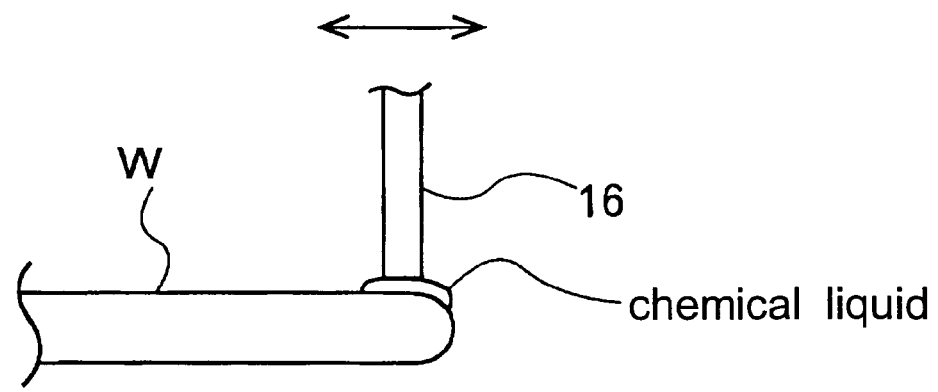
FIGS. 3A and 3B are side views showing other examples of a chemical liquid supply unit of the substrate processing apparatus according to the first embodiment of the present invention.
Figure 3B:
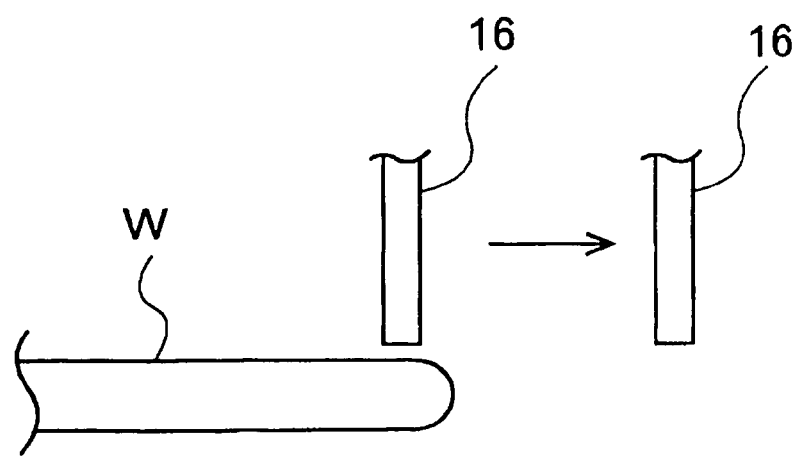

As shown in FIG. 3A, the supply nozzle 16 may be constructed to be moved in the radial direction of the wafer W. With this structure, a process target area can be adjusted as needed. The process target area is a peripheral portion of a wafer and is also an area (an edge cut width) to be processed. Generally, the process target area is set to an area extending radially inwardly about several millimeters, e.g., in the range of 2 to 5 mm, from a circumferential edge (side portion) of a wafer. Further, as shown in FIG. 3B, the supply nozzle 16 may be retreated from the wafer W after the wafer W is processed or when the wafer W is to be transferred out. With this structure, the wafer can be easily transferred in and out.

The chemical liquid supplied from the chemical liquid supply unit 15 to the wafer W is removed from the wafer W by the chemical liquid removal unit 20. As shown in FIG. 2A, this chemical liquid removal unit 20 comprises a suction nozzle 21, and a suction source 23 connected to the suction nozzle 21 through a chemical liquid delivery pipe 22. This suction nozzle 21 has a suction mouth (not shown) which is located at the same radial position as the open end 16a of the supply nozzle 16 with respect to the radial direction of the wafer. Therefore, as shown in FIG. 2C, as the wafer W is rotated, the chemical liquid which has been supplied from the chemical liquid supply unit 15 to the wafer W is transferred to the suction mouth of the suction nozzle 21, and then sucked and removed by the suction nozzle 21.

The suction nozzle 21 and the wafer W are kept in non-contact with each other. In order to improve an efficiency of sucking the chemical liquid, the suction mouth of the suction nozzle 21 is preferably positioned as closely to the wafer W as possible. A vacuum pump, an ejector, or the like may be used as the suction source 23.

Figure 4:
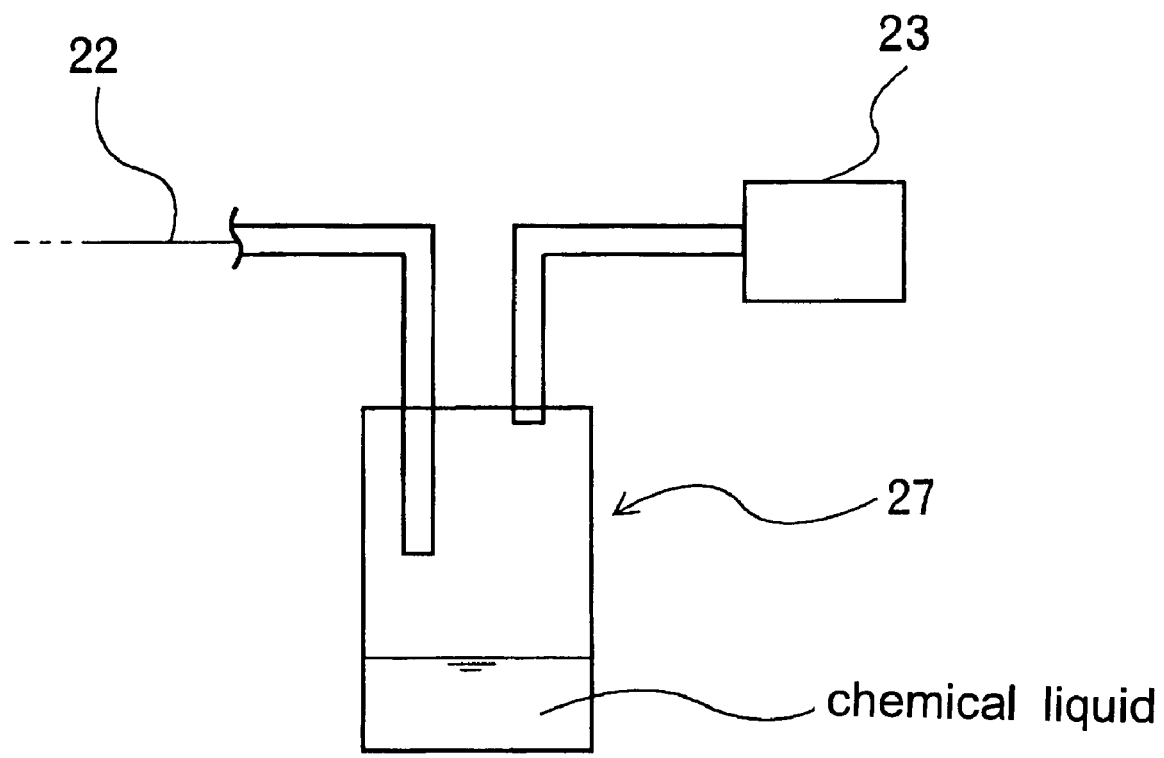
FIG. 4 is a schematic view showing a gas-liquid separator of the substrate processing apparatus according to the first embodiment of the present invention.

FIG. 4 is a schematic view showing a gas-liquid separator of the substrate processing apparatus (the etching apparatus) according to the present embodiment.

As show in FIG. 4, a gas-liquid separator 27 is provided on the chemical liquid delivery pipe 22. A mixture of the chemical liquid and a gas sucked through the suction nozzle 21 by the suction source 23 is introduced into the gas-liquid separator 27, and only the chemical liquid is stored in the gas-liquid separator 27. On the other hand, the gas introduced into the gas-liquid separator 27 is drawn by the suction source 23. A path extending from the suction nozzle 21 to the suction source 23 is secured in gas-tightness in order to improve the suction efficiency of the chemical liquid. A vacuum gauge and a vacuum pressure adjustment valve may be installed in the gas-liquid separator 27 so that a suction force is controlled by adjusting a vacuum pressure.

Figure 5A:
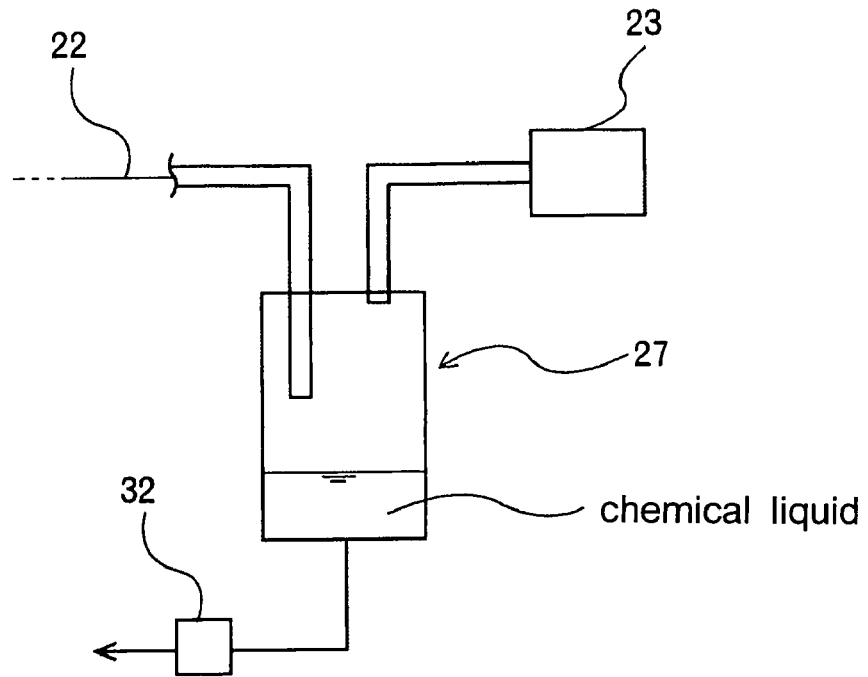
FIG. 5A is a schematic view showing the gas-liquid separator and a recovery unit of the substrate processing apparatus according to the first embodiment of the present invention.
Figure 5B:
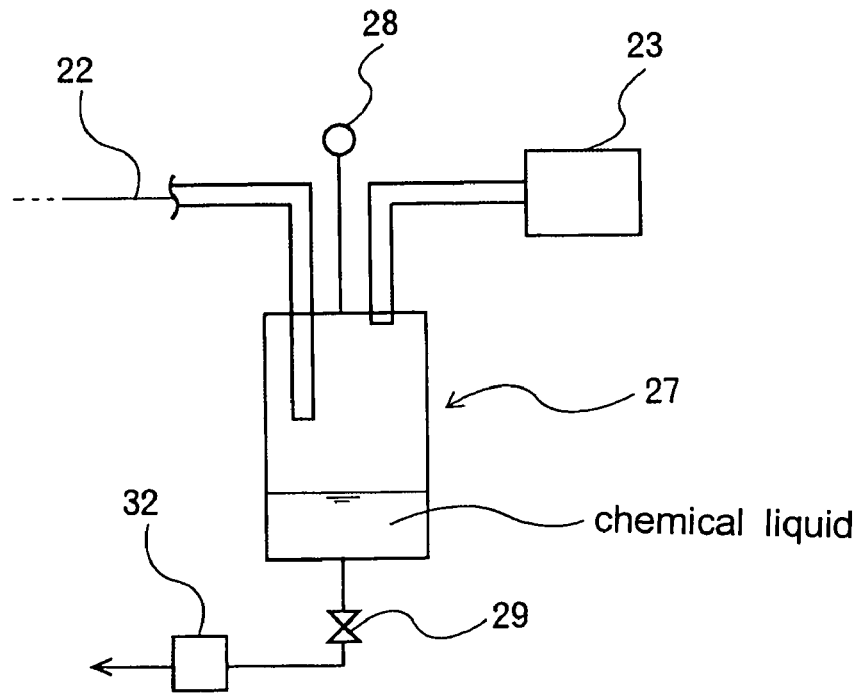
FIG. 5B is a schematic view showing another example of the gas-liquid separator and the recovery unit.

FIG. 5A is a schematic view showing the gas-liquid separator and a recovery unit of the substrate processing apparatus according to the present embodiment, and FIG. 5B is a schematic view showing another example of the gas-liquid separator and the recovery unit.

As shown in FIG. 5A, a recovery unit 32 is connected to a bottom portion of the gas-liquid separator 27, so that the chemical liquid which has been separated by the gas-liquid separator 27 is introduced to the recovery unit 32. The chemical liquid introduced to the recovery unit 32 is filtered by a filter (not shown), and then returned to the above-mentioned chemical liquid storage tank 18 of the chemical liquid supply unit 15. As shown in FIG. 5B, the gas-liquid separator 27 may have a level sensor 28 for detecting a liquid surface level of the stored chemical liquid. Further, after the chemical liquid is sucked and removed from the wafer or when the liquid surface level reaches a predetermined level, a valve may be opened to deliver the chemical liquid to the recovery unit 32.

In this manner, the chemical liquid supplied to the wafer W is recovered through the chemical liquid removal unit 20, the gas-liquid separator 27, and the recovery unit 32, and is then supplied from the chemical liquid supply unit 15 onto the wafer W again. In this embodiment, the chemical liquid which has been supplied to the wafer W is sucked as it is on the wafer W, and hence the chemical liquid can be recovered without being substantially diluted. That is, degrees of the dilution of the chemical liquid and the contamination are greatly lowered, compared with a conventional method in which a chemical liquid which has flowed out of the wafer is recovered from a discharge port of a chamber. Further, in this embodiment, a concentration of the chemical liquid which has been recovered by the recovery unit 32 is not lowered substantially, and hence the processing capability of the chemical liquid to be reused can be maintained.

Next, operation of the substrate processing apparatus (the etching apparatus) according to the present embodiment will be described.

In FIG. 1, first, a wafer W to be processed is held and rotated by the vacuum chuck 11. Then, the etching liquid, such as a mixed liquid of, for example, hydrofluoric acid and hydrogen peroxide is supplied from the supply nozzle 16 of the chemical liquid supply unit 15 onto the peripheral portion of the wafer W which is being rotated. At this time, the inert gas such as a nitrogen gas is supplied from the introduction pipe 9 toward the surface of the wafer W.

Since the inert gas supplied from the introduction pipe 9 flows in the direction from the central portion toward the peripheral portion of the wafer W, it is possible to prevent a chemical liquid atmosphere and mist from flowing toward the central portion of the wafer W. Therefore, it is possible to prevent the surface of the wafer W from being deteriorated due to the chemical liquid atmosphere and the mist, and it is also possible to prevent the copper film from being oxidized due to reaction between oxygen in the atmospheric air and the mist. A supply amount of the inert gas is set such that the chemical liquid atmosphere and the mist do not flow toward the central portion of the wafer and the chemical liquid supplied onto the peripheral portion of the wafer W does not flow out of the wafer.

The chemical liquid is supplied to the wafer W being rotated in such a manner that the chemical liquid on the wafer W is stationary with respect to the wafer W. As the wafer W is rotated, the chemical liquid on the wafer W is transferred to the suction nozzle 21 of the chemical liquid removal unit 20, and then sucked and removed by the suction nozzle 21. Specifically, the chemical liquid is present on the wafer W during a period of time from when the chemical liquid is supplied from the chemical liquid supply unit 15 to when the chemical liquid is removed by the chemical liquid removal unit 20, and the etching process is performed during this period of time. The chemical liquid which has been sucked by the chemical liquid removal unit 20 is delivered to the chemical liquid supply unit 15 via the gas-liquid separator 27 and the recovery unit 32, and is then supplied to the wafer W again from the chemical liquid supply unit 15. After the etching process is finished, ultrapure water is supplied to the wafer W from a non-illustrated cleaning liquid supply unit so as to wash (rinse) out the chemical liquid which has been used in the etching process.

Next, a substrate processing apparatus, which is applied to an etching apparatus, according to a second embodiment of the present invention will be described below with reference to FIGS. 6 and 7. The structure and operation of this embodiment, which will not be described, are identical to those of the first embodiment.

Figure 6:
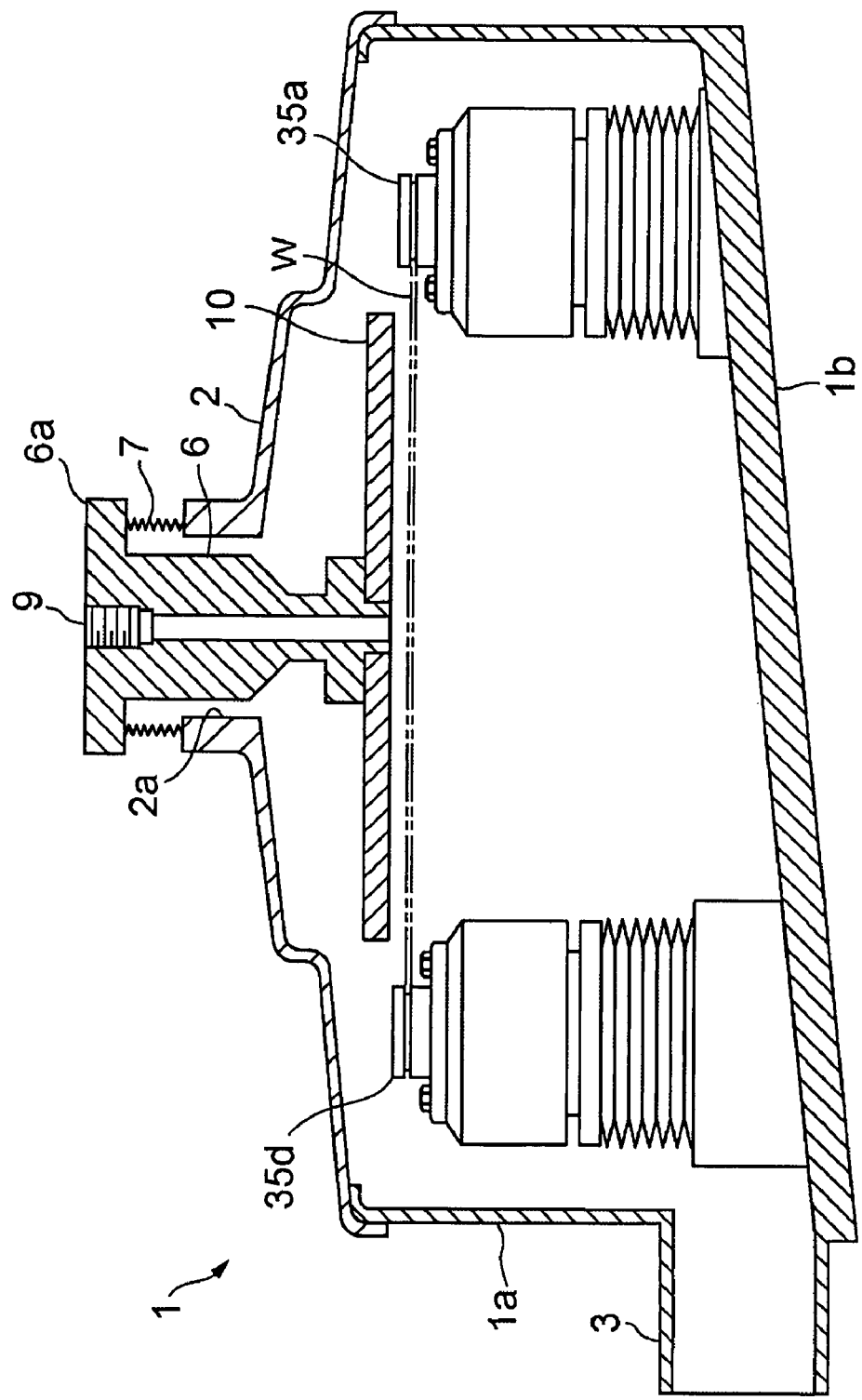
FIG. 6 is a cross-sectional view showing a substrate processing apparatus, which is applied to an etching apparatus, according to a second embodiment of the present invention.
Figure 7:
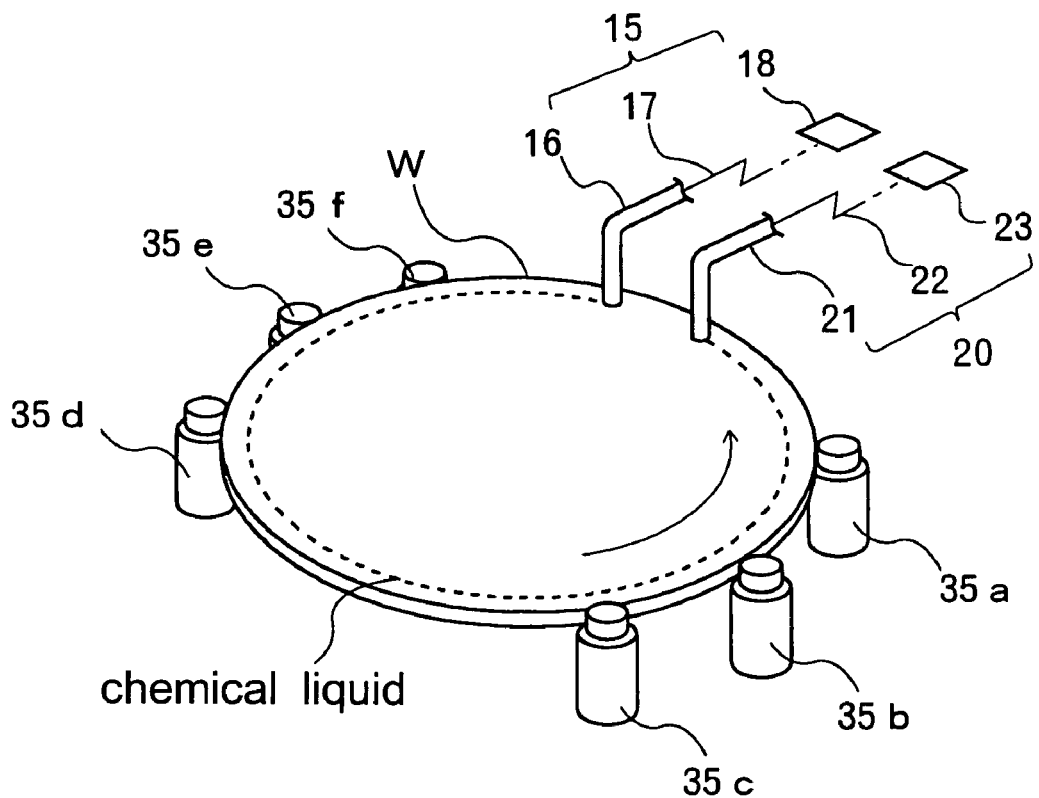
FIG. 7 is a perspective view showing roll chucks and the etching section of the substrate processing apparatus (the etching apparatus) according to the second embodiment of the present invention.

FIG. 6 is a cross-sectional view showing a substrate processing apparatus according to the present embodiment. FIG. 7 is a perspective view showing roll chucks and the etching section of the substrate processing apparatus according to the present embodiment.

The bottom portion 1b has six openings (not shown), and six roll chucks 35a to 35f for holding a wafer W horizontally extend vertically through the six openings. The six roll chucks 35a to 35f are rotated synchronously, so that the wafer W is rotated at a low speed. The chemical liquid supply unit 15 and the chemical liquid removal unit (the etching section) 20 are disposed between the roll chuck 35a and the roll chuck 35f. A rotational speed of the wafer W rotated by the roll chucks 35a to 35f is the same as that in the first embodiment.

As illustrated in this embodiment, even in the case where the roll chucks 35a to 35f are used as the substrate holder, the chemical liquid supply unit 15 and the chemical liquid removal unit 20 can be disposed closely to the wafer W. Therefore, the chemical liquid can be supplied to the wafer W in such a manner that the chemical liquid is stationary with respect to the wafer W which is being rotated, and the chemical liquid can be removed from the wafer W.

Next, a third embodiment of the present invention will be described with reference to FIG. 8.

Figure 8:
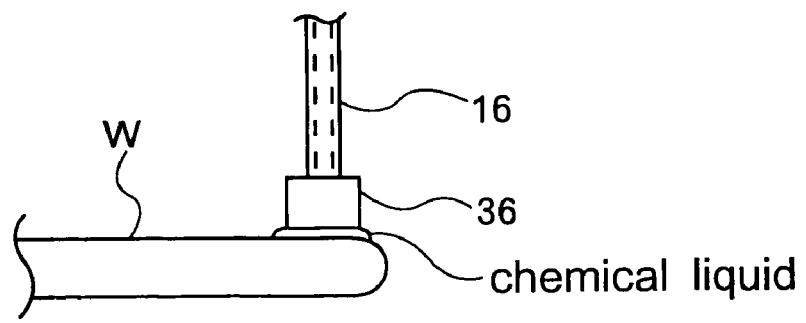
FIG. 8 is a side view showing a chemical liquid supply unit of a substrate processing apparatus, which is applied to an etching apparatus, according to a third embodiment of the present invention.

FIG. 8 is a side view showing a chemical liquid supply unit of a substrate processing apparatus, which is applied to an etching apparatus, according to the present embodiment.

As shown in FIG. 8, in this embodiment, a sponge 36 is attached to a tip end of the supply nozzle 16, so that the chemical liquid oozed from the sponge 36 is supplied to the peripheral portion of the wafer W. The sponge 36 is kept in non-contact with the wafer W, and a distance between the sponge 36 and the wafer W is the same as that in the first embodiment. Instead of the sponge, a porous material such as cloth may be used.

Next, a fourth embodiment of the present invention will be described with reference to FIGS. 9A and 9B.

Figure 9A:
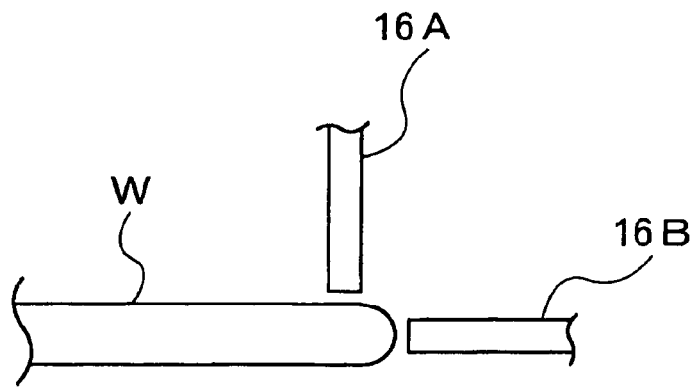
FIG. 9A is a side view showing a chemical liquid supply unit of a substrate processing apparatus, which is applied to an etching apparatus, according to a fourth embodiment of the present invention.

FIG. 9A is a side view showing a chemical liquid supply unit of a substrate processing apparatus, which is applied to an etching apparatus, according to the present embodiment. FIG. 9B is a plan view showing another example of the chemical liquid supply unit and the chemical liquid removal unit of the substrate processing apparatus (the etching apparatus) according to the present embodiment.

As shown in FIG. 9A, a first supply nozzle 16A is disposed above the peripheral portion of a wafer W, and a second supply nozzle 16B is disposed closely to the circumferential edge of the wafer W. Since the chemical liquids are supplied from the two supply nozzles 16A and 16B which are arranged as described above, the processing area of the wafer W can be controlled, and the peripheral portion and the circumferential edge of the wafer W can be processed securely.

Figure 9B:
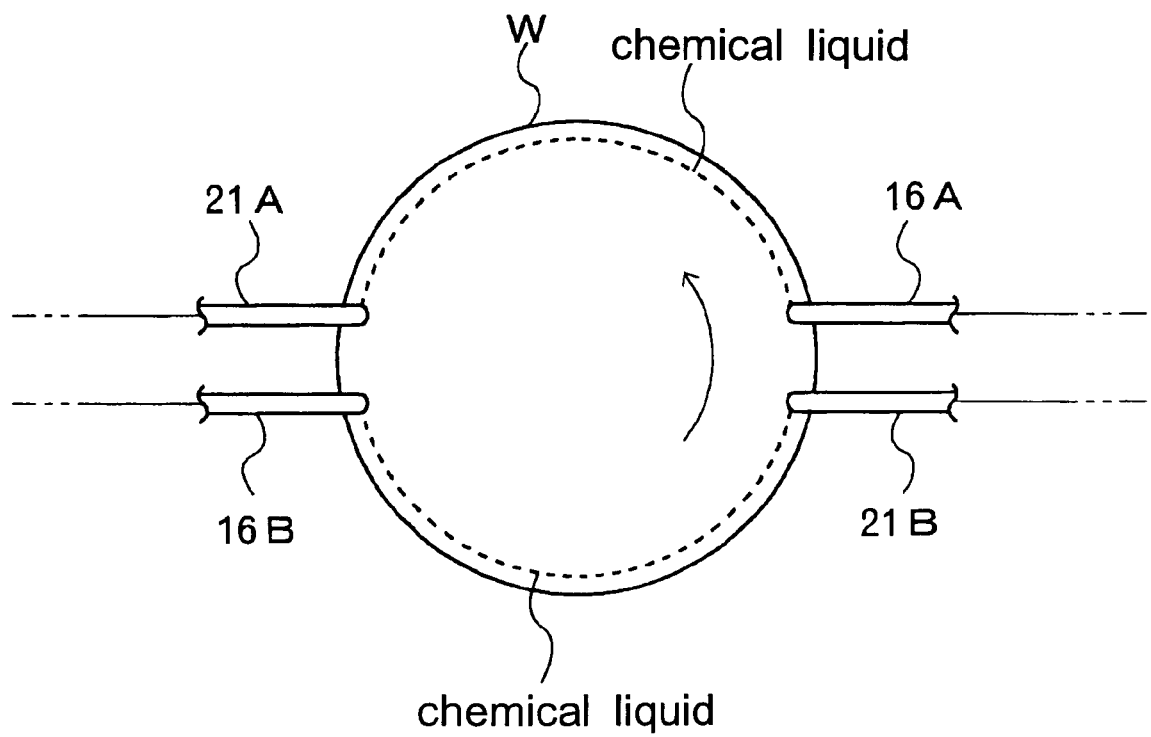
FIG. 9B is a plan view showing another example of the chemical liquid supply unit and a chemical liquid removal unit of the substrate processing apparatus (the etching apparatus) according to the fourth embodiment of the present invention.

Further, as shown in FIG. 9B, two supply nozzles 16A and 16B and two suction nozzles 21A and 21B may be arranged alternately in the circumferential direction of the wafer W. In this case, the same type of chemical liquid may be supplied from the respective supply nozzles 16A and 16B, or different types of chemical liquids may be supplied from the supply nozzles 16A and 16B, respectively. In any case, the chemical liquid supplied from the first supply nozzle 16A is sucked by the first suction nozzle 21A, and the chemical liquid supplied from the second supply nozzle 16B is sucked by the second suction nozzle 21B.

Although the chemical liquid which has been supplied onto the wafer W is removed by the chemical liquid removal unit, a slight amount of the chemical liquid remains on the wafer W. Thus, the substrate processing apparatus has the cleaning liquid supply unit (not shown) for cleaning (rinsing) the wafer W. The cleaning liquid supply unit has a plurality of nozzles disposed at a front side and back side of the wafer W, so that the cleaning liquids (rinsing liquids) are supplied to the wafer W from the nozzles. Ultrapure water is used as the cleaning liquid.

As described above, according to the present invention, a processing liquid can be supplied to a substrate without being scattered. Therefore, a clean atmosphere in the chamber can be maintained, and an efficiency of the reaction between the processing liquid and the wafer can be improved, thus enabling a reduction in an amount of the processing liquid to be used.

Figure 10A:
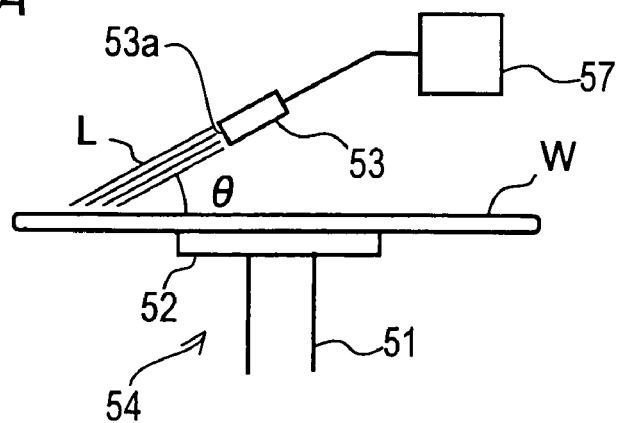
FIG. 10A is a side view showing a substrate processing apparatus, which is applied to a cleaning apparatus, according to a fifth embodiment of the present invention.

Next, a substrate processing apparatus, which is applied to a cleaning apparatus, according to a fifth embodiment of the present invention will be described with reference to FIGS. 10A and 10B. FIG. 10A is a side view showing an essential part of a substrate processing apparatus, which is applied to a cleaning apparatus, according to the present embodiment, and FIG. 10B is a plan view showing an essential part of the substrate processing apparatus (the cleaning apparatus) in the FIG. 10A.

Figure 10B:
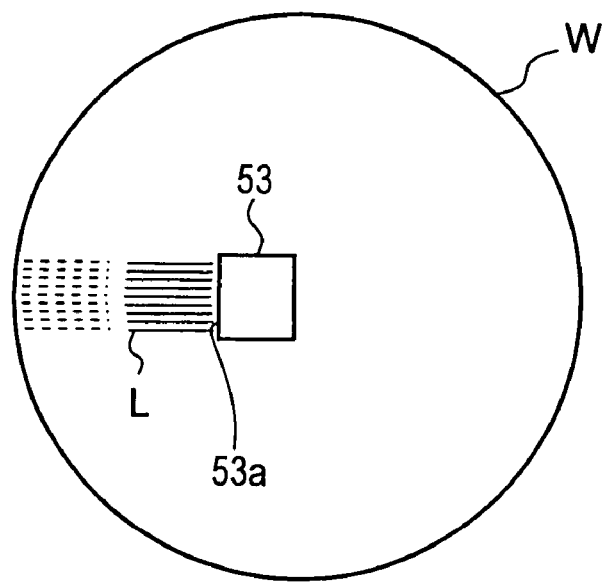
FIG. 10B is a plan view showing an essential part of the substrate processing apparatus (the cleaning apparatus) in FIG. 10A.

The substrate processing apparatus shown in FIGS. 10A and 10B is disposed in the chamber (not shown) for performing an etching process on a copper film. This substrate processing apparatus may be used in both the etching process and a cleaning process, or may serve as a separate-type cleaning apparatus only for the cleaning process. The substrate processing apparatus comprises a substrate holder 54, which has a main shaft 51 and a table 52, for holding a wafer (substrate) W substantially horizontally and rotating the wafer W to be cleaned. The wafer W is fixed to and held by an upper surface of the table 52 by vacuum attraction or the like. A cleaning liquid discharge nozzle (cleaning liquid supply unit) 53 is disposed near a front surface of the wafer W. The cleaning liquid discharge nozzle 53 has an outlet 53a which is oriented from a central portion toward a peripheral portion of the wafer W with an elevation angle θ of not more than 45° from the surface of the wafer W. Therefore, an incident angle of the cleaning liquid L with respect to the surface of the wafer W is the angle θ of not more than 45°. The cleaning liquid L is supplied to a predetermined target area to be cleaned at a flow velocity of not less than 0.1 m/s. The cleaning liquid discharge nozzle (cleaning liquid supply unit) 53 may be disposed at a side of a back surface of the wafer W, or may be disposed at both sides of the front and back surface of the wafer W.

The flow velocity of the cleaning liquid L is adjusted to a predetermined value by a supply equipment 57 having a cleaning liquid storage tank, and then the cleaning liquid L is ejected from the cleaning liquid discharge nozzle 53. The cleaning liquid comprises a rinsing liquid or a chemical liquid suitable for use in removing the remaining processing liquid (etching liquid) which has been used in the etching process.

Since the cleaning liquid is ejected toward the predetermined area to be cleaned at an angle of not more than 45° from the surface of the wafer W, a velocity component in a horizontal direction of the cleaning liquid is larger than a velocity component in a vertical direction. Thus, the cleaning liquid having a large velocity component in the horizontal direction is supplied in the direction from the central portion toward the peripheral portion of the wafer. Therefore, the processing liquid or the like on the target area to be cleaned is quickly washed out from the wafer. Since the flow velocity of the cleaning liquid flowing from the central portion toward the peripheral portion of the wafer is large while the wafer is cleaned, the cleaning liquid can be quickly replaced with new cleaning liquid. Accordingly, an amount of the cleaning liquid to be used can be minimized, and an effective cleaning process can be performed. Further, since the cleaning liquid is supplied only to a necessary area to be cleaned, the amount of the cleaning liquid can be further reduced.

If the cleaning liquid being incident on the substrate has a large velocity component in the vertical direction, the cleaning liquid is scattered due to impingement against the wafer. In this embodiment, because the incident angle of the cleaning liquid with respect to the surface of the wafer is not more than 45°, the velocity component in the vertical direction of the cleaning liquid is low when the cleaning liquid impinges on the wafer, and hence it is possible to prevent the cleaning liquid from being scattered from the surface of the wafer.

From the above viewpoint, the incident angle (elevation angle) with respect to the surface of the wafer should preferably be as small as possible. Specifically, 30° or less is preferable, and 15° or less is more preferable. Although the incident angle of 0° is ideal, the cleaning liquid discharge nozzle 53 cannot be disposed in contact with the surface of the wafer. Therefore, the incident angle (elevation angle) is preferably set such that the incident direction of the cleaning liquid is as parallel to the surface of the wafer as possible.

From a viewpoint of increasing the velocity component in the horizontal direction, the flow velocity of the cleaning liquid is an important factor. Table 1 shows a test result of a cleaning effect with a study of elevation angles and flow velocities. In this table 1, the angles are put in a vertical direction, and the flow velocities are put in a horizontal direction. A sign of "○" in this table 1 shows that an good cleaning result was obtained, and a sign of "X" shows that an good cleaning result was not obtained. The rotational speed of the wafer was 100 min$^{-1}$, and a distance between the target area to be cleaned and the outlet of the cleaning liquid discharge nozzle is in the range of 30 to 50 mm.

TABLE 1

| θ | 0.05 m/s | 0.1 m/s | 0.45 m/s | 0.9 m/s | 1.1 m/s |
|---|---|---|---|---|---|
| 15° | ○ | ○ | ○ | ○ | ○ |
| 25° | X | ○ | ○ | ○ | ○ |
| 35° | X | ○ | ○ | ○ | ○ |
| 45° | X | X | X | ○ | ○ |
| 60° | X | X | X | X | ○ |
| 75° | X | X | X | X | X |

As can be seen from the table 1, in the case in which the cleaning liquid has a flow velocity of 0.1 m/s, a good cleaning result was obtained at an elevation angle ranging from 15° to 35°. In the case in which the cleaning liquid has a flow velocity of 1.1 m/s, a good cleaning result was obtained at an elevation angle ranging from 15° to 60°. Therefore, when the cleaning liquid is supplied at an elevation angle of not more than 45° from the surface of the wafer and the cleaning liquid is supplied to the target area at a flow velocity of not less than 0.1 m/s, a good cleaning result can be obtained. Particularly, the table 1 shows that a small elevation angle is important in obtaining a good cleaning result. The flow velocity is given by dividing a flow rate of the cleaning liquid by an opening area of the outlet of the cleaning liquid discharge nozzle.

If the rotational speed of the wafer is not more than 500 min$^{-1}$, the centrifugal force is small. Therefore, the cleaning liquid does not flow out of the wafer and thus stays on the wafer, and hence it is hard to replace the cleaning liquid with new cleaning liquid. Since the cleaning liquid is supplied from the inward side toward the outward side of the wafer at a flow velocity of not less than 0.1 m/s, the cleaning process can be performed efficiently even when the wafer is rotated at a low speed.

It is preferable that the cleaning liquid discharge nozzle 53 is movable. With this structure, the nozzle 53 can be disposed at a desired position for the target area, to be cleaned, of the wafer. In addition, after the cleaning process, the cleaning liquid discharge nozzle 53 can be retreated from the wafer, so that the wafer can be easily transferred in and out.

Figure 11:
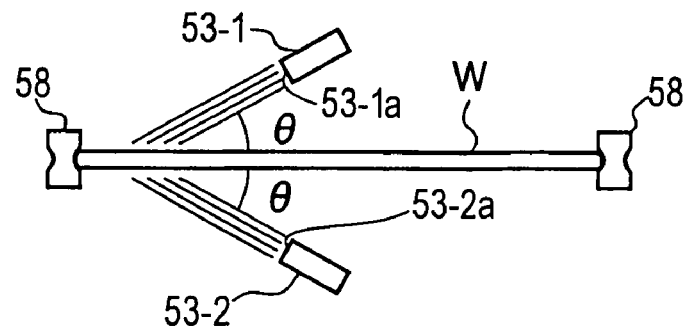
FIG. 11 is a side view showing a modified example of the substrate processing apparatus (the cleaning apparatus) according to the fifth embodiment of the present invention.

FIG. 11 shows a modified example of an essential part of the substrate processing apparatus according to the present embodiment. In this example, cleaning liquid discharge nozzles 53-1 and 53-2 having respective outlets 53-1a and 53-2a are disposed at the front and back sides of the wafer, respectively, so that the front and back surfaces of the wafer W can be cleaned simultaneously. Because of such an arrangement, the substrate folder comprises chucks 58 which are brought into contact with the circumferential edge of the wafer W to hold and rotate the wafer W. This structure allows the cleaning liquid discharge nozzles 53-1 and 53-2 to be disposed at the front and back sides of the wafer W, and hence, as described above, the front and back surfaces of the wafer W can be cleaned simultaneously. The cleaning liquid discharge nozzles 53-1 and 53-2 are not necessarily disposed symmetrically, and the elevation angles and the positions thereof can be changed as needed depending on the cleaning application.

Figure 12A:
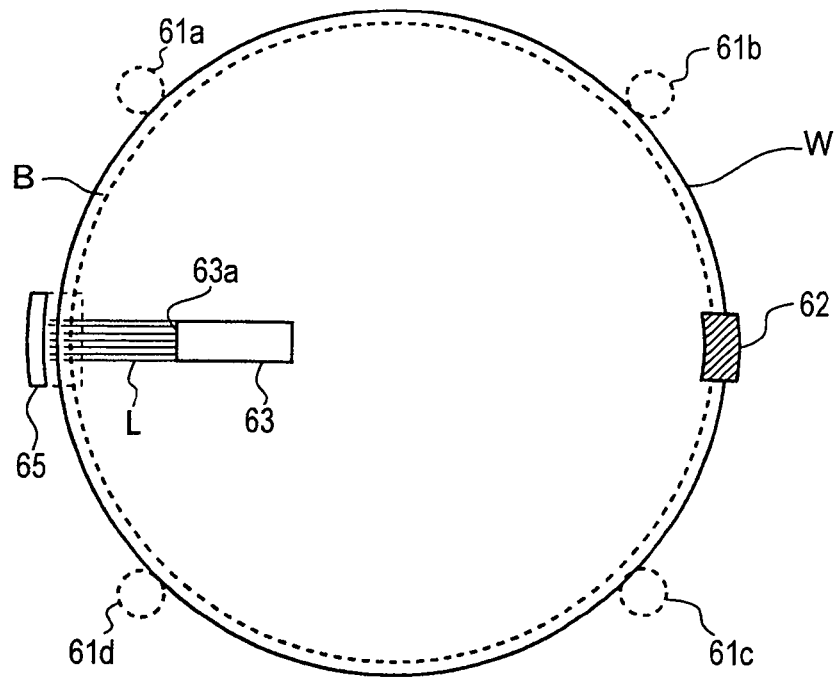
FIG. 12A is a side view showing an essential part of a substrate processing apparatus, which is applied to a cleaning apparatus, according to a sixth embodiment of the present invention.
Figure 12B:
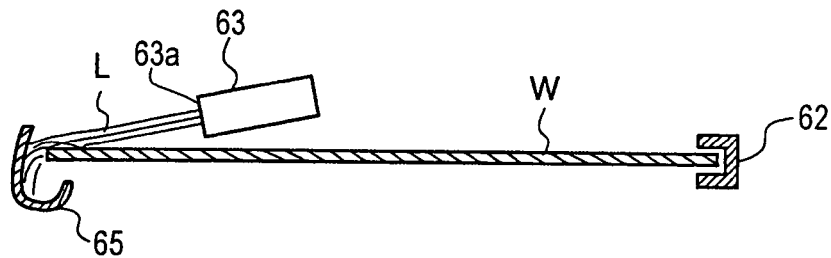
FIG. 12B is a cross-sectional view showing an essential part of the substrate processing apparatus (the cleaning apparatus) in FIG. 12A.
Figure 13:
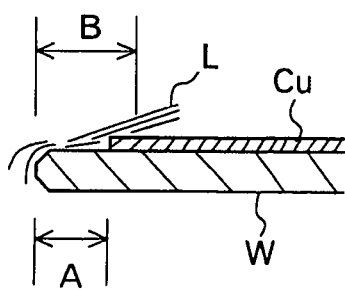
FIG. 13 is a cross-sectional view showing a peripheral portion of the substrate in a cleaning process.

FIG. 12A, FIG. 12B, and FIG. 13 show a substrate processing apparatus, which is applied to a cleaning apparatus, according to a sixth embodiment of the present invention. The substrate processing apparatus (the cleaning apparatus) of this embodiment comprises a substrate holder having chucks 61a, 61b, 61c and 61d for holding a wafer W substantially horizontally and rotating the wafer W. Alternatively, a rotating-table-type substrate holder as shown in FIG. 10A may be used. The substrate processing apparatus also comprises a processing unit 62 for performing an etching process. The processing unit 62 supplies an etching liquid (a processing liquid) to a peripheral portion of the wafer W to remove a thin film such as a copper film formed on the peripheral portion.

This substrate processing apparatus further comprises a cleaning unit (a cleaning liquid supply unit) 63 for washing out an etching liquid remaining on the etching process target area of the wafer W after the etching process is performed. The cleaning unit 63 supplies the cleaning liquid from its cleaning liquid outlet 63a to an area "B" including an etching process target area "A", i.e., the peripheral portion of the wafer W, so as to remove the processing liquid remaining on the area "B". The cleaning liquid flows from the inward side toward the peripheral portion of the wafer W along the radial direction at an elevation angle of not more than 45°, which is set as small as possible, from the surface of the wafer W, thus forming a flow of the cleaning liquid. The cleaning liquid is supplied while the wafer W is being rotated. A receiving unit 65 is disposed on an extended line of the flow of the cleaning liquid L which is supplied in the direction from the central portion to the peripheral portion of the wafer W, and opens toward the area of the wafer W where the cleaning liquid L is supplied to. The receiving unit 65 is positioned on the same plane as the surface of the wafer W. As shown in FIG. 12 B, the receiving unit 65 has a gutter-like shape and receives the cleaning liquid L which has flowed out of the peripheral portion of the wafer W. The processing liquid flowing on the receiving unit 65 is recovered through a non-illustrated drain.

Next, operation of the substrate processing apparatus will be described. First, the wafer W is held and rotated by the chucks 61a, 61b, 61c and 61d. In this state, the etching liquid is supplied from the processing unit 62 to the peripheral portion of the wafer W, so that a copper film formed on the peripheral portion of the wafer W is removed by the etching liquid. This etching process forms the area "A" on the wafer W where the copper film (Cu) has been removed. Then, the area "B" including the area "A" is cleaned by the cleaning unit 63. In this cleaning process, the cleaning liquid is supplied from the cleaning unit (cleaning liquid supply unit) 63 to the target area "B" to be cleaned. At this time, the cleaning liquid is supplied in the direction oriented from the central portion toward the peripheral portion of the wafer at a flow velocity of not less than 0.1 m/s with an incident angle θ from the surface of the wafer W. It is preferable that the incident angle θ is as small as possible, as indicated in the above-mentioned table 1. In order to remove the processing liquid remaining on the area "A" where the etching process has been performed, the area "B" to be supplied with the cleaning liquid L is required to include the area "A". In this case, it is preferable that the area "B" is as small as possible. If the area "B" is small, the amount of the cleaning liquid to be used can be reduced and the cleaning process can be performed efficiently.

By supplying the cleaning liquid L with an elevation angle θ that is as small as possible, at a sufficient flow velocity while rotating the wafer W at a relatively low speed, the area "B" can be cleaned efficiently and securely. According to this cleaning method, because the cleaning liquid is supplied only to the relatively small area while the wafer W is being rotated, the amount of the cleaning liquid to be used can be reduced greatly. Further, because the incident angle θ of the cleaning liquid with respect to the surface of the wafer W is small, it is possible to prevent the processing liquid from being scattered from the surface of the wafer W.

The cleaning liquid, which has been supplied to the peripheral portion of the wafer W, is received by the gutter-like receiving unit 65, and is recovered through the non-illustrated drain. Therefore, the cleaning liquid that has flowed off of the wafer W can be prevented from being scattered in the chamber, and the cleaning liquid can be recovered for reuse.

Although certain embodiments of the present invention have been described in detail, it should be understood that various modifications may be made without departing from the scope of the present invention.

As described above, according to the present invention, a cleaning liquid is supplied to a limited area such as a peripheral portion of a substrate with a small elevation angle, an amount of the cleaning liquid to be used can be reduced. Further, it is possible to prevent contamination of the substrate due to spattering of the cleaning liquid and maintain a clean atmosphere in the chamber.

Next, a plating apparatus for performing copper plating on a semiconductor wafer will be described. This plating apparatus has a substrate processing apparatus, which is applied to an etching apparatus, according to the present invention.

Figure 14:
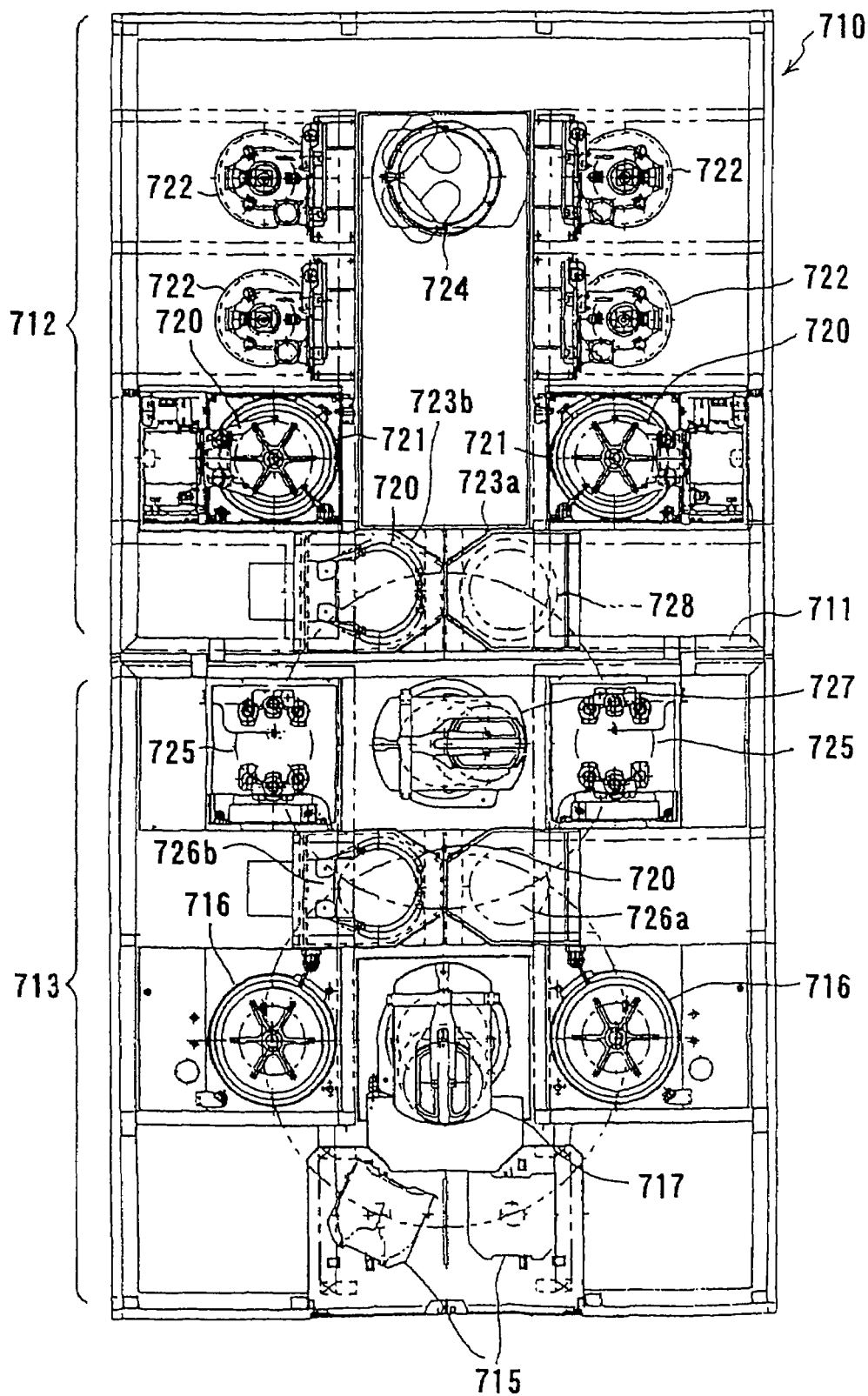
FIG. 14 is a plan view showing a copper plating apparatus incorporating a substrate processing apparatus, which is applied to an etching apparatus, according to the present invention.

As show in FIG. 14, the plating apparatus is disposed in a rectangular facility 710, and is constituted so as to plate wafers (substrates) with copper successively. The facility 710 has a partition wall 711 for dividing the facility 710 into a plating section 712 and a clean section 713. Air can individually be supplied into and exhausted from each of the plating section 712 and the clean section 713. The partition wall 711 has a shutter (not shown) capable of opening and closing. A pressure of the clean section 713 is lower than the atmospheric pressure and higher than a pressure of the plating section 712. This can prevent the air in the clean section 713 from flowing out of the facility 710 and can prevent the air in the plating section 712 from flowing into the clean section 713.

In the clean section 713, there are provided two loading and unloading sections 715 for placing a substrate cassette thereon, and two cleaning units 716 for cleaning (rinsing) a plated wafer with pure water and drying the wafer. Further, a rotatable fixed-type first transfer robot 717 for transferring a wafer is provided in the clean section 713. For example, the cleaning unit 716 has cleaning liquid supply nozzles for supplying ultrapure water to both surfaces of a wafer, and spins the wafer at a high speed to dewater and dry the wafer.

On the other hand, in the plating section 712, there are provided two pretreatment units 721 for pretreating a surface of a wafer to be plated and reversing the pretreated wafer by a reverse mechanism 720, four plating units 722 for plating a surface of a wafer with copper in such a state that the front surface of the wafer faces downwardly, and two first substrate stages 723a and 723b for holding a wafer placed thereon. Further, a rotatable mobile-type second transfer robot 724 for transferring a wafer is provided in the plating section 712.

In this plating apparatus, in the clean section 713, there are provided two substrate processing apparatuses (etching apparatus) 725 for etching a plated wafer with chemical liquid (processing liquid), and second substrate stages 726a and 726b disposed between the substrate processing apparatuses 725 and the cleaning units 716. A rotatable fixed-type third transfer robot 727 for transferring a wafer is provided between the two substrate processing apparatuses 725.

One of the first substrate stages and one of the second substrate stages, i.e., the first substrate stage 723b and the second substrate stage 726b are constituted so as to clean the wafer with water. Each of the first substrate stage 723b and the second substrate stage 726b has a reverse mechanism 720 for reversing a wafer.

Thus, the first transfer robot 717 transfers a wafer between the substrate cassettes placed on the loading and unloading sections 715, the cleaning units 716, and the second substrate stages 726a and 726b. The second transfer robot 724 transfers a wafer between the first substrate stages 723a and 723b, the pretreatment units 721, and the plating units 722. The third transfer robot 727 transfers a wafer between the first substrate stages 723a and 723b, the substrate processing apparatuses 725, and the second substrate stages 726a and 726b.

A container 728 for accommodating wafers for trial operation is disposed in the facility 710, and located below the first substrate stage 723a. The second transfer robot 724 takes out a wafer for trial operation from the container 728, and returns it to the container 728 after trial operation. Thus, the container 728 provided in the facility 710 for accommodating the wafers for trial operation can eliminate contamination or lowering of the throughput caused by introduction of wafers for trial operation from the outside when trial operation is conducted.

As long as the wafers for trial operation can be taken out from the container 728 and returned to the container 728 by any of the transfer robots, the container 728 may be placed anywhere in the facility 710. However, when the container 728 is disposed in the vicinity of the first substrate stage 723a, the trial operation can be conducted in such a manner that a wafer for trial operation is pretreated, plated, cleaned and dried, and then returned to the container 728.

The transfer robot 717 has two recess-type hands. The upper hand is used for handling a dry wafer and the lower hand is used for handling a wet wafer. Each of the transfer robots 724 and 727 has two recess-type hands which are used for handling a wet wafer. The hands of the transfer robots are not limited to those types described above.

Next, an operation flow for processing a wafer in the plating apparatus will be described below. The wafers are accommodated in the cassette in such a state that the front surface of the wafer (surface on which devices are formed, i.e., surface to be processed) faces upwardly, and the cassette is placed on the loading and unloading section 715. The first transfer robot 717 takes out a wafer from the cassette, moves to the second substrate stage 726a, and places the wafer on the second substrate stage 726a. Then, the third transfer robot 727 transfers the wafer from the second substrate stage 726a to the first substrate stage 723a. Thereafter, the second transfer robot 724 receives the wafer from the first substrate stage 723a and transfers the wafer to the pretreatment unit 721. After the pretreatment of the wafer is completed in the pretreatment unit 721, the wafer is reversed by the reverse mechanism 720 so that the front surface of the wafer faces downwardly, and then transferred to the second transfer robot 724. The second transfer robot 724 transfers the wafer to a head of the plating unit 22.

After the wafer is plated and liquid on the wafer is removed in the plating unit 722, the wafer is received by the second transfer robot 724, which transfers the wafer to the first substrate stage 723b. The wafer is reversed by the reverse mechanism 720 provided at the first substrate stage 723b so that the front surface faces upwardly, and then transferred to the substrate processing apparatus 725 by the third transfer robot 727. The wafer is etched by the substrate processing apparatus 725, and then transferred to the second substrate stage 726b by the third transfer robot 727. Next, the first transfer robot 717 receives the wafer from the second substrate stage 726b, and transfers the wafer to the cleaning unit 716. In the cleaning unit 716, the wafer is rinsed with pure water (including deionized water) and then spin-dried. The dried wafer is returned to the substrate cassette placed on the loading and unloading section 715 by the first transfer robot 717.

What is claimed is:

1. A substrate processing apparatus, comprising:
   a substrate holder for holding and rotating a substrate substantially horizontally;
   a supply nozzle having an open end for supplying a processing liquid onto a peripheral portion of an upper surface of the substrate which is to be rotated;
   a supply unit communicating with said supply nozzle for supplying the processing liquid onto the substrate via said supply nozzle;
   a suction nozzle having a suction mouth configured to suck the processing liquid on the peripheral portion of the upper surface of the substrate in an upward direction, said suction mouth of said suction nozzle being located at the same radial distance from a center point of the substrate as said open end of said supply nozzle, and said suction mouth of said suction nozzle being located adjacent to said open end of said supply nozzle, said suction mouth of said suction nozzle and said open end of said supply nozzle being arranged so as to face the upper surface of the substrate;
   a suction unit communicating with said suction nozzle for sucking the processing liquid from the substrate via said suction nozzle; and
   wherein said substrate holder is operable to rotate the substrate in a direction such that said suction mouth of said suction nozzle is located at a position forward of said open end of said supply nozzle with respect to a rotational direction of the substrate, and such that a distance traveled by the processing liquid supplied onto the substrate via said supply nozzle during a single rotation of said substrate holder is greater than a distance between said supply nozzle and said suction nozzle;

wherein said substrate holder is operable to rotate the substrate at a speed low enough to allow the supplied processing liquid to remain stationary on the upper surface of the substrate during rotation of the substrate.

2. The substrate processing apparatus according to claim 1, wherein said drive source and said substrate holder are operable to rotate the substrate at a speed of not more than 500 $min^{-1}$.

3. The substrate processing apparatus according to claim 1, wherein said drive source and said substrate holder are operable to rotate the substrate at a speed in a range of 5 $min^{-1}$ to 200 $min^{-1}$.

4. The substrate processing apparatus according to claim 1, wherein a distance between said open end of said supply nozzle and the upper surface of the substrate is not more than 5 mm.

5. The substrate processing apparatus according to claim 1, wherein said supply unit is operable to supply processing liquid to the substrate via said supply nozzle such that a flow rate of the processing liquid supplied through said open end of said supply nozzle is not more than 100 ml/min.

6. The substrate processing apparatus according to claim 1, wherein said supply nozzle and said suction nozzle are adjacent to each other.

7. The substrate processing apparatus according to claim 1, further comprising a gas liquid separator coupled to said suction nozzle for separating the sucked processing liquid from a gas.

8. The substrate processing apparatus according to claim 7, further comprising a recovery unit for recovering the processing liquid which has been separated by said gas liquid separator, and to supply the recovered processing liquid to said supply nozzle.

9. The substrate processing apparatus according to claim 1, wherein said supply nozzle comprises a first supply nozzle having said open end, further comprising a second supply nozzle having an open end;

wherein said suction nozzle comprises a first suction nozzle having said suction mouth, further comprising a second suction nozzle having a suction mouth;

wherein said first supply nozzle and said second supply nozzle are arranged symmetrically about the center point of the substrate; and wherein said first suction nozzle and said second suction nozzle are arranged symmetrically about the center point of the substrate.

10. The substrate processing apparatus according to claim 9, wherein said first supply nozzle and said second suction nozzle are adjacent to each other; and wherein said second supply nozzle and said first suction nozzle are adjacent to each other.

11. The substrate processing apparatus according to claim 1, wherein said supply nozzle comprises a first supply nozzle having said open end, further comprising a second supply nozzle having an open end, said second supply nozzle being arranged so as to extend in a direction perpendicular to a direction of extension of said first supply nozzle, and arranged so that said open end of said second supply nozzle faces a peripheral edge of the substrate.

12. The substrate processing apparatus according to claim 1, wherein said supply nozzle, said suction nozzle, and said substrate holder are arranged such that a travel distance of a reference point located on the peripheral portion of the upper surface of the substrate to be rotated by said substrate holder is greater when traveling from a location at which the reference point is located adjacent to said open end of said supply nozzle to a location at which the reference point is located adjacent to said suction mouth than a travel distance of the reference point when traveling from a location at which the reference point is located adjacent to said suction mouth of said suction nozzle to a location at which the reference point is located adjacent to said open end of said supply nozzle.

13. The substrate processing apparatus according to claim 1, wherein each of said supply nozzle and said suction nozzle comprises a tube arranged orthogonally with respect to the upper surface of the substrate.

* * * * *